(12) United States Patent
Kakuta et al.

(10) Patent No.: US 6,796,809 B2
(45) Date of Patent: Sep. 28, 2004

(54) ELECTRICAL JUNCTION BOX

(75) Inventors: Hirokazu Kakuta, Tokyo (JP); Mitsuo Tanaka, Tokyo (JP); Takayuki Uchiyama, Tokyo (JP)

(73) Assignee: The Furukawa Electric Co., Ltd. (JP)

( * ) Notice: Subject to any disclaimer, the term of this patent is extended or adjusted under 35 U.S.C. 154(b) by 0 days.

(21) Appl. No.: 10/443,566

(22) Filed: May 22, 2003

(65) Prior Publication Data

US 2003/0219998 A1 Nov. 27, 2003

(30) Foreign Application Priority Data

May 24, 2002 (JP) ........................................ 2002-150971

(51) Int. Cl.⁷ ............................................. H01R 12/00
(52) U.S. Cl. ..................... 439/76.2; 439/949; 439/206
(58) Field of Search ............................... 439/76.2, 949, 439/206, 205, 934

(56) References Cited

U.S. PATENT DOCUMENTS

| | | | | |
|---|---|---|---|---|
| 5,618,186 A | * | 4/1997 | Saka et al. ................. | 439/76.2 |
| 6,008,982 A | * | 12/1999 | Smith ........................ | 361/624 |
| 6,126,457 A | * | 10/2000 | Smith et al. ............... | 439/76.2 |
| 6,270,359 B1 | * | 8/2001 | Kondo et al. ............... | 439/76.2 |
| 6,430,054 B1 | * | 8/2002 | Iwata ......................... | 361/752 |
| 6,478,585 B2 | * | 11/2002 | Yuasa et al. ................ | 439/76.2 |
| 6,520,780 B2 | * | 2/2003 | Chemin ...................... | 439/76.2 |
| 6,524,136 B2 | * | 2/2003 | Kawaguchi et al. ........ | 439/621 |
| 6,600,658 B2 | * | 7/2003 | Iwata ......................... | 361/752 |

FOREIGN PATENT DOCUMENTS

| | | |
|---|---|---|
| JP | 5-70123 | 9/1993 |
| JP | 7-16528 | 3/1995 |
| JP | 10-051932 | 2/1998 |

* cited by examiner

*Primary Examiner*—Gary Paumen
(74) *Attorney, Agent, or Firm*—Cantor Colburn LLP

(57) ABSTRACT

An electrical junction box includes a lower case containing wiring boards with busbars such that the boards stand upright, an upper case combined with the lower case, upper and lower connection terminals extended from each wiring board and vertically penetrating through an inclined upper terminal supporting member and a lower terminal supporting member, respectively. The upper terminal supporting member forms part of drain path which has a rim formed at a peripheral edge thereof except for the lower end thereof. Water that has entered the junction box is guided along the inclined upper terminal supporting member, and then drops from the lower end thereof into a drainpipe of the lower case.

7 Claims, 4 Drawing Sheets

ELECTRICAL JUNCTION BOX

CROSS-REFERENCE TO RELATED APPLICATION

This application is based upon and claims the benefits of priority from the prior Japanese Patent Application No. 2002-150971, the contents of which are incorporated herein by reference.

BACKGROUND OF THE INVENTION

1. Field of the Invention

This invention relates to an electrical junction box, and more particularly, to an electrical junction box mounted on a motor vehicle for interconnecting wire harnesses laid inside the vehicle.

2. Description of the Related Art

An electrical junction box mounted on a motor vehicle has numerous electrical connection terminals densely populated in a small space thereof. It is therefore necessary to prevent the connection terminals from being connected and thus short-circuited by water which has entered the electrical junction box during a rainfall or the washing of the vehicle or by small drops of water which are formed inside the junction box by condensation.

Unexamined Japanese Utility Model Publication No. 5-70123 discloses an electrical junction box containing a laminated wiring board formed by stacking busbars and insulating substrates one upon another. This publication proposes a structure for preventing a grounding busbar for a grounded circuit, which is situated on the lowermost layer of the laminated wiring board, from being short-circuited due to bridging of water collected on the bottom of a lower case of the electrical junction box. Specifically, the lowermost insulating substrate is provided with ribs. The ribs are formed on a lower surface of the lowermost insulating substrate and defines grooves for arranging the grounding busbar and the other busbars thereof according to a predetermined layout. On the other hand, water bridge prevention ribs are arranged at the bottom of the lower case so as to face the ribs of the lowermost insulating substrate of the laminated wiring board, to completely isolate the grounding busbar from the other busbars by means of the ribs of the lowermost insulating substrate and the water bridge prevention ribs and thereby prevent the grounding busbar from being connected to the other busbars due to bridging of water.

With this short circuit prevention structure, however, water collects on the bottom of the lower case and possibly corrodes the busbars.

Unexamined Japanese Utility Model Publication No. 7-16528 discloses an electrical junction box containing an insulating substrate with busbars. Each busbars has tab protruding from the busbar. The electrical junction box has outlet holes formed through the bottom of a lower case thereof to allow the tabs of busbars to be extended outside. Each outlet hole is in the form of a cross so as to permit the tab to pass therethrough as well as to drain water flowing down to the bottom of the lower case.

Even with this structure, water present between the busbars and the insulating substrate or water formed on the busbars by condensation cannot be drained out and possibly corrodes the busbars.

Unexamined Japanese Patent Publication No. 10-51932 also discloses an electrical junction box containing a laminated wiring board formed by stacking insulating substrates with busbars one upon another. Each insulating substrate has a drain hole formed in a central portion thereof and a drainpipe protruding downward from the drain hole. The drainpipe is contact with the lower insulating substrate and connected to the drain hole thereof. Further, a water shutoff rib with a constant height is formed on each insulating substrate and surrounds the drain hole thereof and the drainpipe of the upper insulating substrate. Thus, part of water that has entered the electrical junction box and is present on each insulating substrate flows over the water shutoff rib and is guided through a gap between the drain pipe of the upper insulating substrate and the upper surface of the insulating substrate, the drain holes and drainpipe toward the bottom of a lower case of the junction box. The remaining part of water, which failed to flow over the water shutoff ribs, flows back toward the outer peripheral edges of the insulating substrate and is guided to the bottom of the lower case through gaps between the inner wall surface of the lower case and the outer peripheral edges of the individual substrates.

Since the busbars are arranged on the insulating substrates, however, water which failed to flow over the water shutoff ribs is obstructed when flowing toward the outer peripheral edges of the insulating substrates through small spaces between the busbars and the insulating substrates located directly above. It is therefore difficult to completely drain water from the individual layers of the laminated wiring board, possibly causing a situation where the busbars are corroded.

SUMMARY OF THE INVENTION

An object of the present invention is to provide an electrical junction box for a motor vehicle which can prevent electrical connection terminals arranged therein from being short-circuited by water that has entered or is formed inside the electrical junction box and also can prevent the connection terminals from being corroded by water remaining in the junction box.

To achieve the object, the present invention provides an electrical junction box comprising: a lower case containing a wiring board with basbars such that the wiring substrate stands upright; an upper case combined with the lower case; a plurality of upper connection terminals extended from the wiring board and vertically penetrating through an upper terminal supporting member attached to the wiring board to be supported by the upper terminal supporting member, the upper connection terminals extending upward and fitted into the upper case; a plurality of lower connection terminals extended from the wiring board and vertically penetrating through a lower terminal supporting member attached to the wiring substrate to be supported by the lower terminal supporting member, the lower connection terminals extending downward and penetrating through the lower case; and short circuit prevention means for preventing the upper connection terminals and/or the lower connection terminals from being connected and thus short-circuited by water that has entered the electrical junction box.

The above and other objects, features and advantages of the present invention will become apparent from the following description.

DETAILED DESCRIPTION OF THE PREFERRED EMBODIMENT

An embodiment of the present invention will be hereinafter described in detail with reference to the accompanying drawings.

Figure 1:
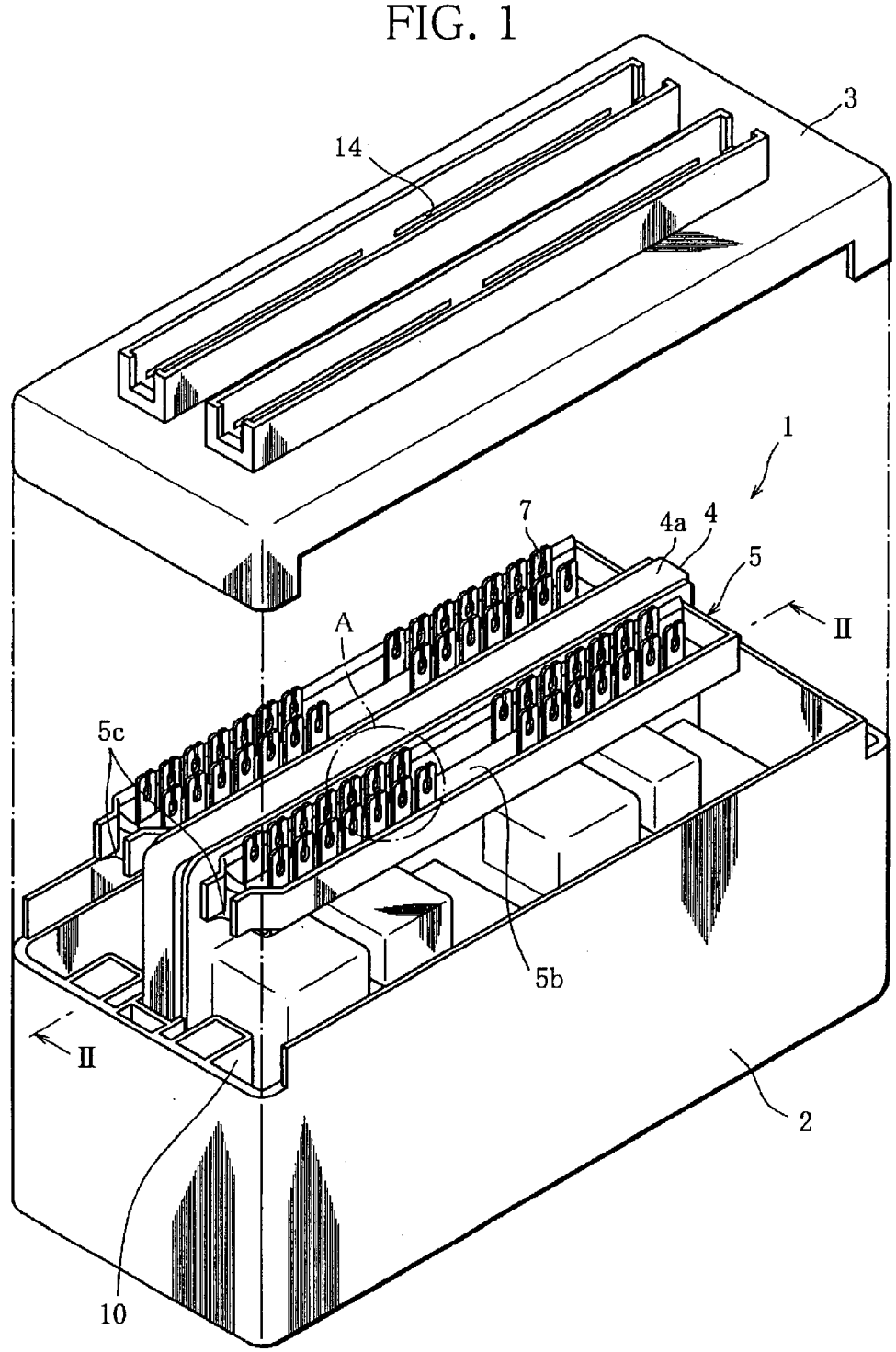
FIG. 1 is an exploded view of an electrical junction box according to one embodiment of the present invention.
Figure 2:
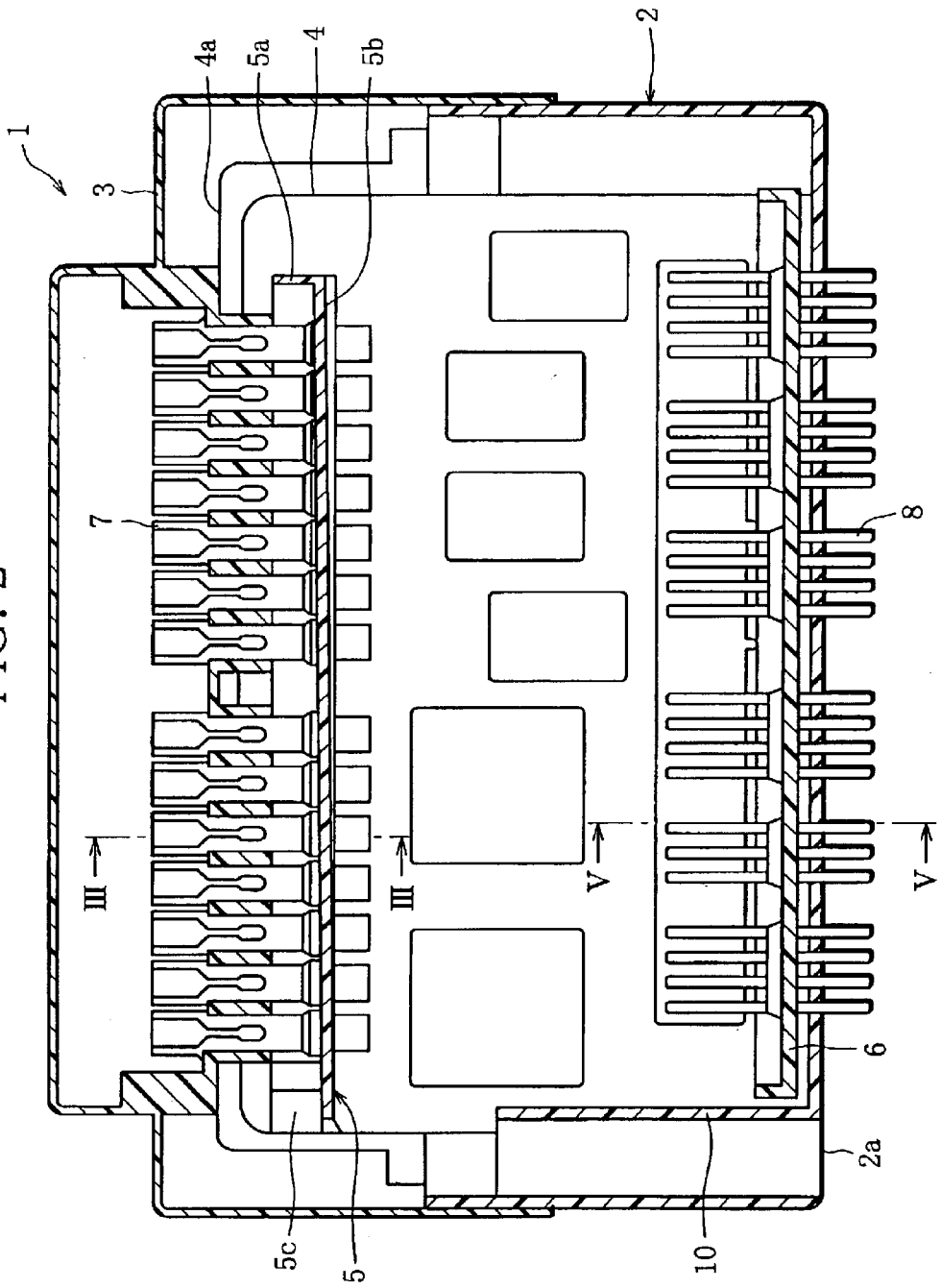
FIG. 2 is a sectional view taken along line II—II in FIG. 1.

As shown in FIGS. 1 and 2, an electrical junction box 1 of this embodiment comprises lower and upper cases 2 and 3 combined together. Two wiring boards 4 are contained in the lower case 2 such that the wiring boards 4 stand upright with a heat dissipation member (power plate) 4a interposed therebetween. The wiring boards 4 comprises an insulating substrate and busbars, respectively. An upper terminal supporting member 5 and a lower terminal supporting member 6 (not shown in FIG. 1) are attached to upper and lower portions, respectively, of each wiring board 4, to support upper and lower connection terminals 7 and 8, respectively.

The upper terminal supporting member 5 is a rectangular dish in shape, and has a bottom 5b inclined in a manner such that a left-hand portion thereof, as viewed in FIG. 1, is located lower than the right-hand portion and a rim 5a protruding from a peripheral edge the bottom 5b. Part of the rim 5a situated at the lowest left end of the bottom 5b is cut away so as to form a drain port 5c, and a drainpipe 10 is located right under the drain port 5c. The drainpipe 10 is integrally formed on the inner surface of the lower case 2 and communicates at lower end with an opening 2a formed in the bottom of the lower case 2.

In this embodiment, the wiring boards 4, which are two in number, are contained in the lower case such that the wiring boards 4 stand upright, and the numerous connection terminals 7 and 8 are extended from the wiring substrates 4. The connection terminals 7 and 8 are electrically connected to the corresponding busbar, respectively. Thus, unlike the aforementioned conventional laminated structures in which insulating substrates with busbars are vertically stacked one upon another, water present between each busbar and its corresponding insulating substrate or water formed on the busbars by condensation can be prevented from remaining in such small spaces.

Also, during a rainfall or the washing of the vehicle, water entering the electrical junction box 1 from above is once received by the upper terminal supporting members 5 and flows along the inclined bottoms 5a leftward to the lower ends thereof. Then, the water drops from the drain port 5c at the left end of the rim 5a down into the drainpipe 10 and is drained out through the opening 2a in the lower case 2. Consequently, even if water enters the electrical junction box 1, it is quickly and completely drained out of the junction box 1, so that short circuit of the connection terminals is not caused by such water.

Figure 3:
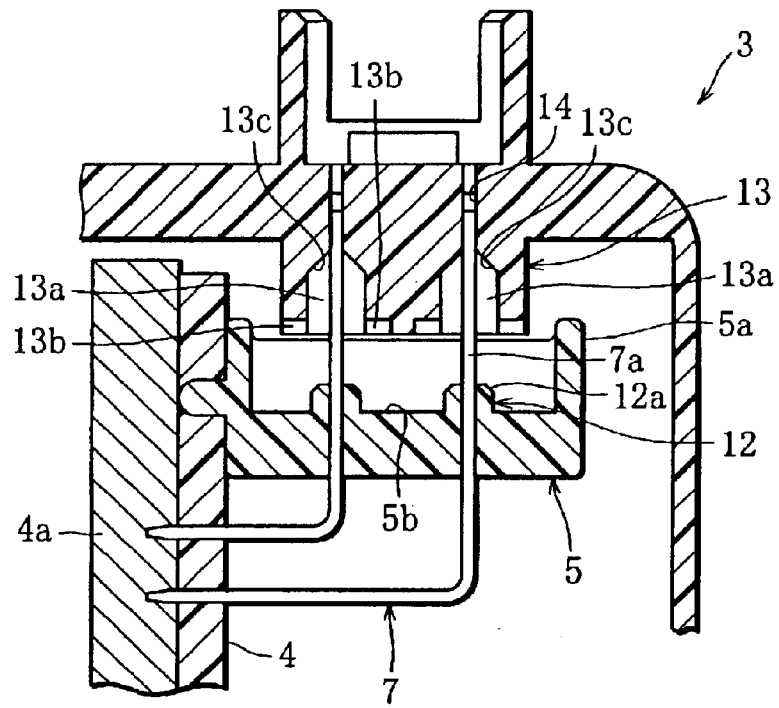
FIG. 3 is a sectional view showing an upper terminal supporting member and upper connection terminals arranged on the upper side of a wiring substrate, taken along line III—III in FIG. 2.

As shown in FIG. 3, each upper connection terminal 7 extends horizontally from the upper portion of the wiring board 4, is bent at a right angle, and then extends upward, thus forming an L shape as a whole. The vertical portion 7a of the upper connection terminal 7 extends through a bump 12 of the upper terminal supporting member 5, and the bump 12 serves to prevent the vertical portion 7a from tilting in the horizontal direction. The bump 12 is integrally formed on the bottom 5b of the upper terminal supporting member 5. Also, the vertical portion 7a of the upper connection terminal 7 is inserted into a corresponding one of slits 14 which are formed in a connection terminal receiving section 13 and extends in parallel with the wiring board 4. The connection terminal receiving section 13 is formed as part of the upper wall of the upper case 3. Thus, the upper case 3 is fitted with a connector (e.g., mini fuse) having connection terminals arrayed in accordance with the layout of the upper connection terminals 7, whereupon electrical connection is established between the upper connection terminals 7 and the respective connection terminals of the connector.

In this embodiment, the connection terminal receiving section 13 further includes holes 13a formed in a lower portion thereof, the holes 13a having taper end 13c communicated with the slits 14, respectively. Each upper connection terminal 7 is therefore inserted through the hole 13a into the slit 14.

Thus, water entering each slit 14 from the upper wall surface of the upper case 3 gradually flows down through a small clearance between the inner wall of the slit 14 and the upper connection terminal 7 and, on reaching the hole 13a, begins to flow down more quickly along the inner wall of the hole 13a and the upper connection terminal 7 because the taper end 13c of the holes 13a suddenly increases the space surrounding the terminal 7 so that the water is no longer confined in the slit 14. Then, the water drops from the lower end face of the connection terminal receiving section 13 down to the bottom 5b of the upper terminal supporting member 5. After this, the water flows along the inclined bottom 5b of the upper terminal supporting member 5, drops from the drain port 5c formed at the lower end of the rim 5a, and is drained out of the electrical junction box 1 through the drainpipe 10 and the opening 2a of the lower case 2, as mentioned above.

While water remains in the slits 14, it does not connect the upper connection terminals 7 to one another, but if water stagnates in the upper terminal supporting member 5 after passing through the slits 14 and the holes 13a, the upper connection terminals 7 may possibly be connected and short-circuited by such water. In this embodiment, however, since the holes 13a has the taper end 13c communicated with the slit 14 and the bottom 5b of the upper terminal supporting member 5 is inclined, the water does not stagnate anywhere after passing through the slits 14, but is quickly drained out of the electrical junction box 1 as mentioned above, thus eliminating the possibility of short circuit. Further, the lower end face of the connection terminal receiving section 13 is provided with water guide grooves 13b for causing the water from the holes 13a to flow farther away from the vertical portions 7a of the upper connection terminals 7. Thus, the water flowing down along the inner wall of the holes 13a is guided along the water guide grooves 13b and drops therefrom to the bottom 5b of the upper terminal supporting member 5 at locations sufficiently separated from the vertical portions 7a of the upper connection terminals 7. This serves to minimize water adhering to the vertical portions 7a of the upper connection terminals 7, whereby short circuit is scarcely caused by water connecting the upper connection terminals 7.

Figure 4:
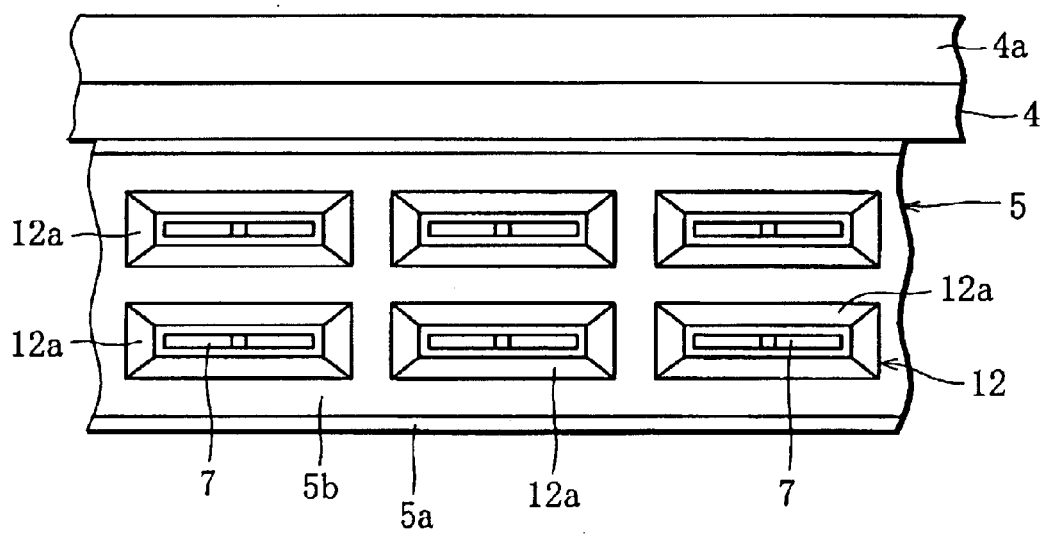
FIG. 4 is a plan view of a part indicated at A in FIG. 1.

Also, in this embodiment, each bumps 12 of the upper terminal supporting member 5, through which the vertical portion 7a of the upper connection terminal 7 extends, has a tapered top 12a as shown in FIG. 4. Accordingly, even if water fails to flow along the inner wall of the hole 13a and thus flows down along the vertical portion 7a of the upper connection terminal 7 or water is shaken off from the water guide groove 13b onto the upper connection terminal 7 and flows down along the vertical portion 7a (e.g., when the electrical junction box mounted on a motor vehicle is vibrated while the vehicle is running), such water does not stagnate at the boundary between the vertical portion 7a of the upper connection terminal and the bump 12, but is guided along the tapered top 12a of the bump 12 and quickly reaches the bottom 5b of the upper terminal supporting member 5. The water is thereafter quickly drained out of the electrical junction box 1 along the course mentioned above.

In this embodiment, the boundary between each bump 12 and the corresponding upper connection terminal 7, that is, the tapered top 12a of the bump 12 is located at a predetermined height from the bottom 5b of the upper terminal supporting member 5 and is separated therefrom. Thus, even if water is formed by condensation on the vertical portions 7a of the upper connection terminals 7 and is guided along the terminals 7 down to the bottom 5b of the upper terminal supporting member 5, such water scarcely connects the adjacent upper connection terminals 7 to each other, unlike the case where no bumps are provided. Besides, the bumps 12 each have the tapered top 12a and the bottom 5b of the upper terminal supporting member 5 is inclined; therefore, it is possible to virtually perfectly eliminate the possibility that water formed by condensation stays in the upper terminal supporting member 5 and short-circuits the adjacent upper connection terminals 7.

Figure 5:
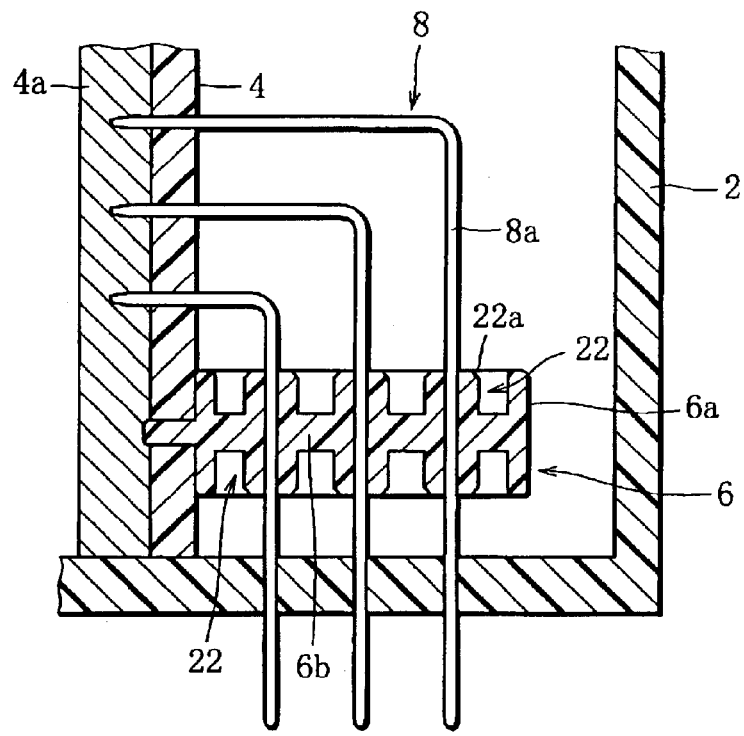
FIG. 5 is a sectional view showing the lower terminal supporting member and lower connection terminals arranged on the lower side of the wiring substrate, taken along line V—V in FIG. 2.

As shown in FIG. 5, each lower connection terminal 8 extends horizontally from the lower portion of the wiring substrate 4, is bent at a right angle, and then extends downward, thus forming an L shape as a whole. The lower connection terminals 8 is electrically connected to the corresponding busbar of the wiring board 4. The vertical portion 8a of the lower connection terminal 8 extends through a rib 22 of the lower terminal supporting member 6, and the rib 22 serves to prevent the vertical portion 8a from tilting in the horizontal direction. The rib 22 is protruded from a bottom plate 6b of the lower terminal supporting member 6 to the upper and lower sides thereof, respectively.

The lower connection terminals 8 are grouped such that three or four vertical portions 8a lined up along the wiring board 4 constitute one group, and the groups thus formed are arrayed in three rows, which are guided to the underside of the lower case 2 through slits (not shown) formed through the bottom thereof. A connector having sockets arrayed in accordance with the layout of the lower connection terminals 8 is connected to the lower case 2 from below, whereupon the lower connection terminals 8 are electrically connected with connection terminals in the respective sockets of the connector.

Figure 6:
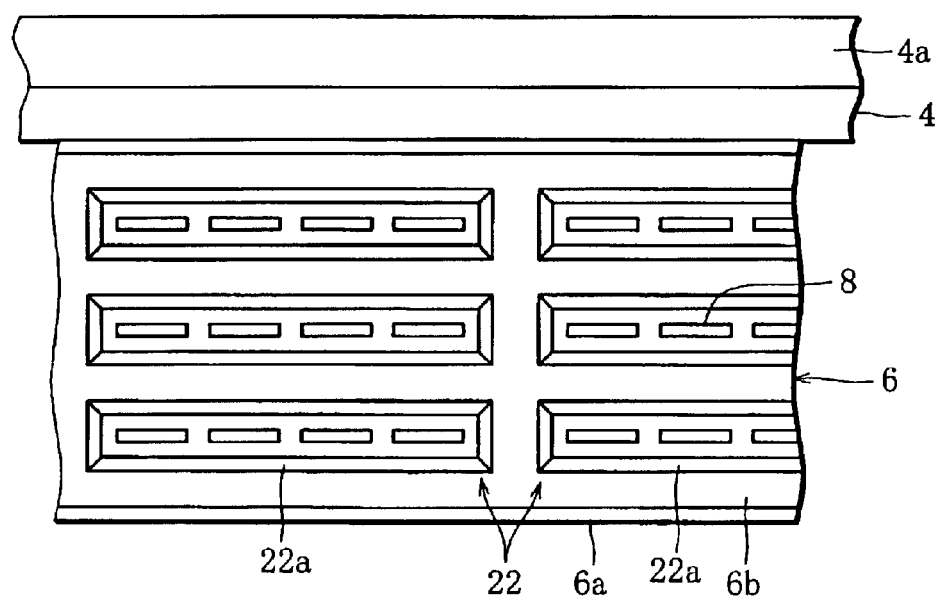
FIG. 6 is a plan view showing part of a lower terminal supporting member and lower connection terminals arranged on the lower side of the wiring substrate

In this embodiment, each rib 22 has a height of 5 mm or more from the upper surface of the bottom plate of the lower terminal supporting member 6 and has an upper peripheral edge chamfered along the entire circumference, thus forming a tapered top 22a as shown in FIG. 6. Thus, water formed by condensation on the vertical portion 8a of the lower connection terminal 8 flows down along the vertical portion 8a and is quickly guided along the tapered top 22a of the rib 22 down to the bottom plate 6b of the lower terminal supporting member 6, without stagnating at the boundary between the vertical portion 8a of the lower connection terminal and the rib 22 or the tapered top 22a.

Also, the lower terminal supporting member 6 has a rim 6a protruding from a peripheral edge of the bottom plate 6b, so that the water guided to the bottom plate 6b of the lower terminal supporting member 6 stays in the supporting member 6 until it evaporates.

According to this embodiment, the tapered top 22a of each rib 22 is located at the predetermined height from the bottom plate 6b of the lower terminal supporting member 6 and is separated therefrom. Thus, even if water is formed by condensation on the vertical portions 8a of the lower connection terminals 8 and is guided along the terminals 8 down to the bottom plate 6b of the lower terminal supporting member 6, such water scarcely connects the adjacent lower connection terminals 8 with each other, unlike the case where no ribs are provided. Besides, each rib 22 has the tapered top 22a and thus water does not remain at the boundary between the tapered top 22a and the lower connection terminal 8. It is therefore possible to virtually perfectly eliminate the possibility of the adjacent lower connection terminals 8 being connected with each other by water.

Unlike the upper terminal supporting member 5, the bottom plate 6b of the lower terminal supporting member 6 is not inclined and the rim 6a is not cut away at one end of the supporting member 6 for draining water into a drainpipe. However, since water entering the electrical junction box from outside does not reach the lower terminal supporting member 6 and also the quantity of water formed by condensation is small, the water in the supporting member 6 need not be immediately drained out of the junction box and may be left there until it evaporates. If necessary, however, the lower terminal supporting member 6 may be constructed in the same manner as the upper terminal supporting member 5 so that water formed by condensation can be drained out of the electrical junction box.

What is claimed is:

1. An electrical junction box comprising:
   a lower case containing a wiring board with busbars such that the wiring board stands upright;
   an upper case combined with said lower case;
   a plurality of upper connection terminals extended from the wiring board and vertically penetrating through an upper terminal supporting member attached to the wiring board to be supported by the upper terminal supporting member, said upper connection terminals extending upward and fitted to said upper case;
   a plurality of lower connection terminals extended from the wiring board and vertically penetrating through a lower terminal supporting member attached to the wiring board to be supported by the lower terminal supporting member, said lower connection terminals extending downward and penetrating through said lower case; and
   short circuit prevention means for preventing said upper connection terminals and/or said lower connection terminals from being connected and thus short-circuited by water that has entered said electrical junction box.

2. The electrical junction box according to claim 1, wherein said short circuit prevention means includes tapered holes formed in said upper case, the tapered holes being located beneath slits in said upper case where said upper connection terminals are fitted.

3. The electrical junction box according to claim 1, wherein said short circuit prevention means includes a rim formed at a peripheral edge of the upper terminal supporting member, and tapered bumps which are formed on the upper terminal supporting member and through which respective ones of said upper connection terminals vertically penetrate.

4. The electrical junction box according to claim 2, wherein said short circuit prevention means includes
- a bottom formed on the upper terminal supporting member, the bottom being inclined in a manner such that one end thereof is located lower than the other,
- a rim formed at a peripheral edge of the bottom except for the lower end thereof, and
- a drainpipe located right under the lower end of the bottom and communicating with an opening formed through a case bottom of said lower case.

5. The electrical junction box according to claim 3, wherein said short circuit prevention means includes
- a bottom formed on the upper terminal supporting member, the bottom being inclined in a manner such that one end thereof is located lower than the other,
- a rim formed at a peripheral edge of the bottom except for the lower end thereof, and
- a drainpipe located right under the lower end of the bottom and communicating with an opening formed through a case bottom of said lower case.

6. The electrical junction box according to claim 1, wherein said short circuit prevention means includes a rim formed at a peripheral edge the lower terminal supporting member, and tapered ribs which are formed on the lower terminal supporting member and through which respective ones of said lower connection terminals vertically penetrate.

7. An electrical junction box comprising:
- a lower case;
- a upper case combined with said lower case;
- a wiring board contained in said lower case, said wiring board including busbars, upper connection terminals extending upward from said wiring board and fitted to said upper case, and lower connection terminals extending downward from said wiring board and penetrating through said lower case;
- a upper supporting member attached to said wiring board, said upper supporting member allowing the upper connection terminals to penetrate therethrough and supporting the upper connection terminals;
- a lower supporting member attached to said wiring board, said lower supporting member allowing the lower connection terminals to penetrate therethrough and supporting the lower connection terminals; and
- drain paths for preventing the connection terminals from being short-circuited by water that has entered said electrical junction box.

* * * * *